United States Patent
Sit et al.

(10) Patent No.: US 7,592,840 B2
(45) Date of Patent: Sep. 22, 2009

(54) DOMINO CIRCUIT WITH DISABLE FEATURE

(75) Inventors: Kin Yip Sit, Sunnyvale, CA (US); Shahram Jamshidi, Cupertino, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/557,913

(22) Filed: Nov. 8, 2006

(65) Prior Publication Data

US 2008/0106302 A1    May 8, 2008

(51) Int. Cl.
*H03K 19/00*    (2006.01)
(52) U.S. Cl. ............................ 326/112; 326/93; 326/95; 326/98
(58) Field of Classification Search .................... 326/93, 326/95, 98
See application file for complete search history.

(56) References Cited

U.S. PATENT DOCUMENTS

| | | | |
|---|---|---|---|
| 4,897,657 A * | 1/1990 | Brubaker | 341/159 |
| 6,707,318 B2 | 3/2004 | Kumar | |
| 6,914,848 B2 | 7/2005 | Jamshidi | |
| 6,952,118 B2 | 10/2005 | Jamshidi | |
| 7,302,652 B2 | 11/2007 | Chen | |
| 2006/0114029 A1* | 6/2006 | Anderson et al. | 326/95 |
| 2007/0103356 A1* | 5/2007 | Makino et al. | 341/155 |
| 2007/0290729 A1* | 12/2007 | Chen | 327/172 |
| 2007/0296465 A1* | 12/2007 | Al-Assadi et al. | 326/98 |

OTHER PUBLICATIONS

U.S. Appl. No. 09/044,392, filed Mar. 18, 1998 entitled "Domino-Logic Gates with Improved Noise Immunity"; inventor Shahram Jamshidi.

* cited by examiner

*Primary Examiner*—Rexford Barnie
*Assistant Examiner*—Thienvu V Tran
(74) *Attorney, Agent, or Firm*—Erik R. Nordstrom

(57) ABSTRACT

Some embodiments provide dynamic circuits with dynamic nodes that may float during a disable mode to reduce leakage.

7 Claims, 1 Drawing Sheet

DOMINO CIRCUIT WITH DISABLE FEATURE

TECHNICAL FIELD

Embodiments of the present invention relate generally to logic circuits and in particular to power saving dynamic logic circuits.

BRIEF DESCRIPTION OF THE DRAWINGS

Embodiments of the invention are illustrated by way of example, and not by way of limitation, in the figures of the accompanying drawings in which like reference numerals refer to similar elements.

DETAILED DESCRIPTION

Figure 1:
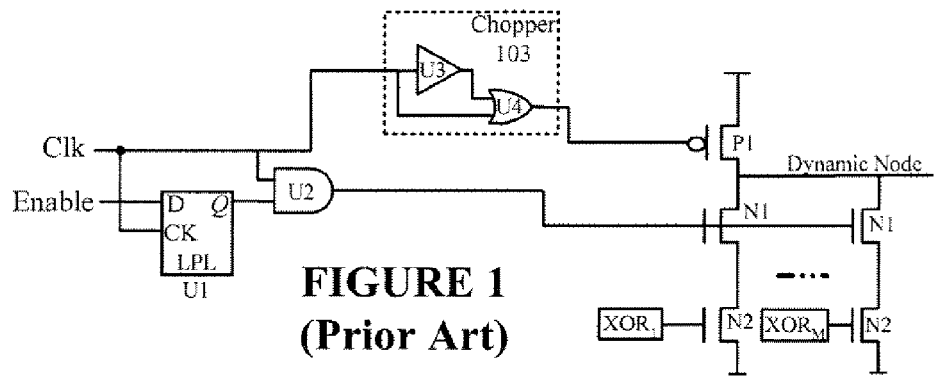
FIG. 1 is a diagram of a portion of a conventional dynamic circuit.

With reference to FIG. 1, a portion of a conventional dynamic (or domino) logic circuit with a dynamic node is shown. This circuit has an enable/disable feature that allows it to be disabled to save power for periods when the circuit is not in use. It comprises a low-phase latch U1, AND gate U2, chopper circuit 103 (formed from driver U3 and OR gate U4), precharge PMOS transistor P1, and M evaluation stacks formed from series-coupled NMOS transistors N1 and N2. (the term "low-phase latch" refers to a latch that is transparent during a low clock phase and opaque during a high clock phase. Likewise, the term "high-phase latch" would refer to a latch that is transparent during a high clock phase and opaque during a low clock phase.)

(The term "PMOS transistor" refers to a P-type metal oxide semiconductor field effect transistor. Likewise, "NMOS transistor" refers to an N-type metal oxide semiconductor field effect transistor. It should be appreciated that whenever the terms: "transistor", "MOS transistor", "NMOS transistor", or "PMOS transistor" are used, unless otherwise expressly indicated or dictated by the nature of their use, they are being used in an exemplary manner. They encompass the different varieties of MOS devices including devices with different VTs and oxide thicknesses to mention just a few. Moreover, unless specifically referred to as MOS or the like, the term transistor could include other suitable transistor types, e.g., junction-field-effect transistors, bipolar-junction transistors, and various types of three dimensional transistors, known today or not yet developed.)

The precharge transistor P1 and evaluation stacks are coupled to the dynamic node to perform, in this case, a logical NOR function. In each evaluation stack, N1 functions as a footer (and will be referred to as such, even though it is not at the bottom of the stack), while N2 functions as a gate input transistor. (In the depicted figure, the input of each gate input transistor N2 is coupled to a bit output from an XOR circuit, e.g., to implement a content addressable memory structure.) A clock (CLK) is coupled to the precharge transistor P1 through the chopper circuit 103, while each footer (N1) is coupled to the clock through AND gate U2, whose inputs are coupled to the clock and to an enable signal (Enable) through low-phase latch U1. The low-phase latch U1 function to ensure that the enable) signal asserts at the AND gate input sufficiently ahead of an evaluation phase (i.e., at the beginning of a precharge phase) for the dynamic node to precharge and for the asserted enable signal and gate input signals to be sufficiently stable during the evaluation phase.

When the circuit is to be enabled, the Enable signal asserts (goes High) upon a clock transition. (It is assumed that the Enable signal is coming from some clocked, state element.) Once the Enable signal asserts (High) and the clock goes Low, the asserted Enable High value passes through latch U1 to its associated input at AND gate U2. However, even though the enable input at AND gate U2 is now High, the N1 footer transistors remain off since the clock is in its Low phase causing the AND output to be Low. At this time, the precharge transistor P1 turns on charging the dynamic node. When the clock goes High (evaluate phase), N1 then turns on, P1 turns off, and the dynamic node "evaluates." In evaluating, it either sufficiently discharges to a logic Low if any $XOR_i$ input to a gate input transistor N2 is High, or alternatively, it sufficiently remains charged (logic High) if all gate inputs are Low. While the circuit remains enabled, it continues to precharge and evaluate until the clock is stopped or it is once again disabled. The chopper circuit 103 serves to extend the evaluation phase and correspondingly compress the precharge phase in each cycle for enhanced performance capability.

When the circuit is disabled, the Enable signal de-asserts (Low) and when the clock goes Low, the de-asserted Enable (Low) is passed through latch U1 to the AND gate input. This causes the AND output to go Low and maintain the footer transistors N1 turned off. If the clock is kept running, the precharge transistor P1 continues to switch with the dynamic node remaining charged thereby enabling a quick restart. In other schemes (not shown), the dynamic node may be "parked" at VSS to reduce leakage through the stacks.

Unfortunately, there are several drawbacks associated with this approach. When the circuit is disabled and the dynamic node is kept High, there may be unreasonable leakage through the stacks, especially with newer, so-called sub-micron processes. On the other hand, if the dynamic node is parked Low, the precharge transistor still switches (unless the clock is gated), which may result in capacitive switching losses in the precharge transistor P1. Even if the clock is gated (turned off) and the dynamic node is parked Low, there will be sub-threshold leakage through the precharge transistor P1. Moreover, it may be inefficient and/or performance limiting to disable the circuit for short intervals (e.g., 2 or 3 cycles) when the dynamic node is parked. In the following sections, novel solutions to some or all of these problems are presented.

Figure 2:
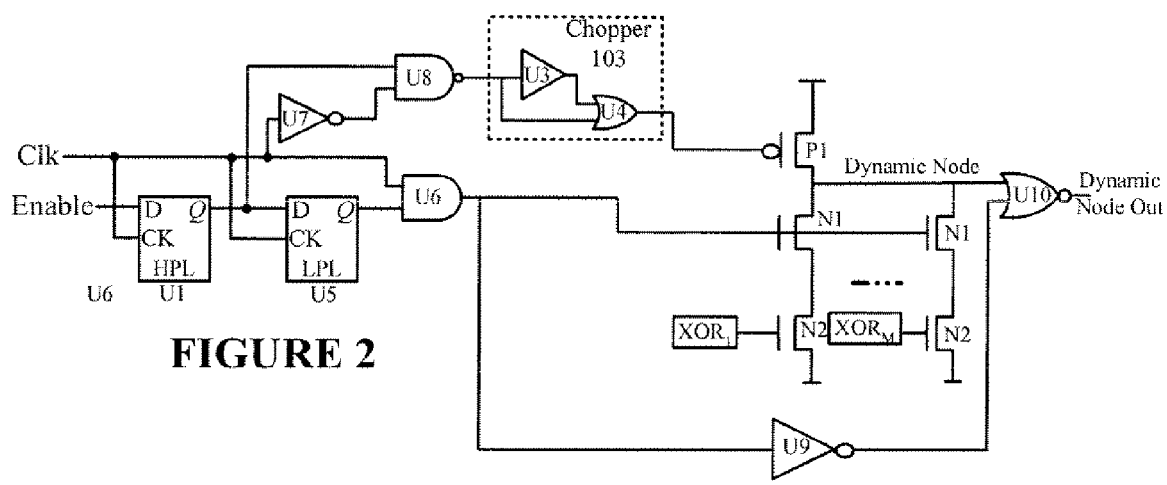
FIG. 2 is a diagram of a portion of a dynamic logic circuit in accordance with some embodiments.

FIG. 2 shows a portion of a dynamic circuit, in accordance with some embodiments, that utilizes a floating dynamic node during a disable mode. with a floating dynamic node, losses (e.g., leakage) can be reduced both in the evaluation stacks, as well as in the precharge transistor(s). In addition, the disable mode can be entered and departed from "on the fly" without unreasonably affecting performance and power savings.

The depicted circuit comprises high-phase latch U1, low-phase latch U5, AND gate U6, inverter U7, NAND gate U8, chopper circuit 103, inverter U9, NOR gate U10, precharge transistor P1, and evaluation stacks formed from transistors N1 and N2, all coupled together as shown. Inverter U7 and NAND gate U8 are coupled between the clock, first latch (U1) output and chopper circuit 103, as shown, so that when the circuit is disabled (Enable is Low), the precharge transistor P1 is turned off. Similarly, AND gate U6 is coupled between the footer transistors N1 and the output of the second latch U2 and clock, as shown, so that the footer transistors are also turned off when the circuit is disabled. Thus, during a disabled mode, the dynamic node floats, and the precharge and footer transistors are off resulting in reduced leakage. Inverter U9 and NOR gate U10 function to place the dynamic node output at a known state (Low in the depicted embodiment) during a disable mode. This may be desired or even required in some implementations. At the same time, when the circuit is enabled (Enable is High), these elements allow the circuit to properly operate with precharge transistor P1 turning on and footer transistors N1 turning off during precharge clock phases and conversely, precharge transistor P1 turning off and footer transistors N1 turning on during evaluation clock phases.

High-phase latch U1 and low phase latch U5 provide for the circuit to start in a precharge phase, i.e., upon a high-to-low clock transition. After the Enable signal asserts, the circuit has most (if not all) of a precharge clock phase to precharge before its first evaluation after being enabled. This also means that the gate input signals will have most of a precharge phase to arrive/stabilize before this first evaluation. In addition, the low-phase latch U5 provides for a stable enable signal at U6 during a domino evaluation, as it is non-transparent during high phases.

It should be appreciated that depending how signals are timed and/or provided to the circuit, different elements may be used to achieve suitable results. for example, different latches or flip-flops could be used for U1 and U5, depending upon the parameters of the circuit environment. In some embodiments, they may even be omitted, in whole or in part. Similarly, there are many different ways to implement a given logic function and thus, the invention is not limited to the specific gates and gate configurations illustrated in FIG. 2. for example, AND functions can be implemented with NAND gates and an inverter or inverters and NOR gates an so on. In addition, certain features like a chopper circuit may not be used in some embodiments. Alternatively, other elements such as keeper circuitry may be added in some embodiments, depending on the requirements of a given design.

Figure 3:
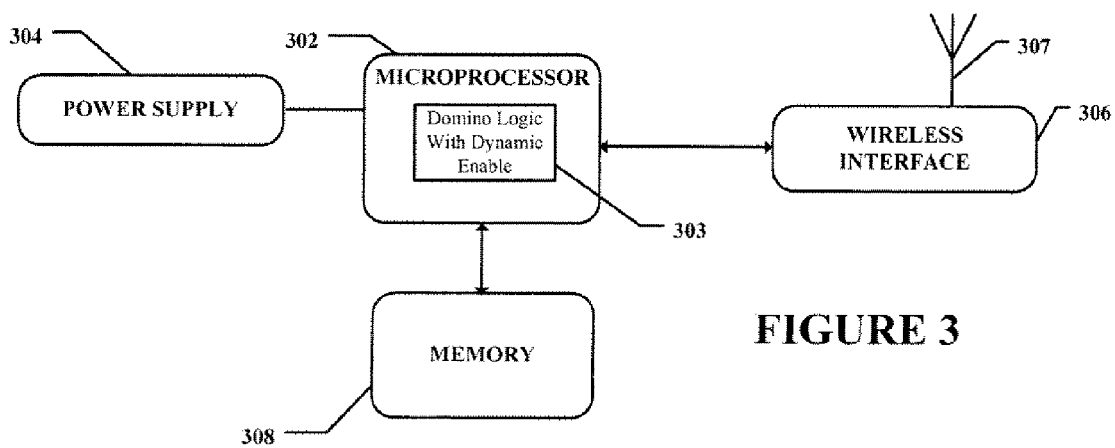
FIG. 3 is a block diagram of a computer system having a microprocessor with at least one dynamic logic circuit in accordance with some embodiments.

With reference to FIG. 3, one example of a computer system is shown. The depicted system generally comprises a processor 302 that is coupled to a power supply 304, a wireless interface 306, and memory 308. It is coupled to the power supply 304 to receive from it power when in operation. The wireless interface 306 is coupled to an antenna 307 to communicatively link the processor through the wireless interface chip 306 to a wireless network (not shown). Microprocessor 302 comprises one or more dynamic logic circuits 303 with a floating dynamic node in a disable mode.

It should be noted that the depicted system could be implemented in different forms. That is, it could be implemented in a single chip module, a circuit board, or a chassis having multiple circuit boards. Similarly, it could constitute one or more complete computers or alternatively, it could constitute a component useful within a computing system.

The invention is not limited to the embodiments described, but can be practiced with modification and alteration within the spirit and scope of the appended claims. For example, it should be appreciated that the present invention is applicable for use with all types of semiconductor integrated circuit ("IC") chips. Examples of these IC chips include but are not limited to processors, controllers, chip set components, programmable logic arrays (PLA), memory chips, network chips, and the like.

Moreover, it should be appreciated that example sizes/models/values/ranges may have been given, although the present invention is not limited to the same. As manufacturing techniques (e.g., photolithography) mature over time, it is expected that devices of smaller size could be manufactured. In addition, well known power/ground connections to IC chips and other components may or may not be shown within the FIGS. for simplicity of illustration and discussion, and so as not to obscure the invention. Further, arrangements may be shown in block diagram form in order to avoid obscuring the invention, and also in view of the fact that specifics with respect to implementation of such block diagram arrangements are highly dependent upon the platform within which the present invention is to be implemented, i.e., such specifics should be well within purview of one skilled in the art. Where specific details (e.g., circuits) are set forth in order to describe example embodiments of the invention, it should be apparent to one skilled in the art that the invention can be practiced without, or with variation of these specific details. The description is thus to be regarded as illustrative instead of limiting.

What is claimed is:

1. A chip, comprising:
    a dynamic logic circuit having a dynamic node, the circuit to be in an enabled or disabled mode, wherein the dynamic node is to float when the circuit is in the disabled mode; and
    at least one latch to provide for the circuit to precharge for substantially a clock phase before evaluating after it is enabled, the at least one latch including a high phase latch followed by a low phase latch;
    a chopper circuit to extend evaluation phases when the dynamic logic circuit is enabled;
    a gate coupled to the dynamic node to provide a known output value when the dynamic logic circuit is in the disabled mode, wherein the gate is a NOR gate.

2. The chip of claim 1, in which the NOR gate is also coupled to an enable signal that determines whether the circuit is in the enabled or disabled mode.

3. The chip of claim 2, in which the NOR gate is coupled to the enable signal through an inverter.

4. The chip of claim 1, in which the at least one latch comprises an edge-triggered flip flop.

5. An integrated circuit, comprising:
    a dynamic logic circuit having a dynamic node to float during a disabled mode;
    at least one latch to provide for the circuit to precharge for substantially a clock phase before evaluating after it leaves the disabled mode, the at least one latch including a high phase latch followed by a low phase latch;
    a chopper circuit to extend evaluation phases when the dynamic logic circuit is enabled;
    a gate coupled to the dynamic node to provide a known output value when the dynamic logic circuit is in the disabled mode, wherein the gate is a NOR gate.

6. The integrated circuit of claim 5, in which the NOR gate is also coupled to an enable signal that determines whether the circuit is in an enabled or the disabled mode.

7. The integrated circuit of claim 5, in which the at least one latch comprises an edge-triggered flip flop.

* * * * *